United States Patent [19]

Rosenbluth

[11] Patent Number: 4,896,952
[45] Date of Patent: Jan. 30, 1990

[54] THIN FILM BEAMSPLITTER OPTICAL ELEMENT FOR USE IN AN IMAGE-FORMING LENS SYSTEM

[75] Inventor: Alan E. Rosenbluth, Yorktown Heights, N.Y.

[73] Assignee: International Business Machines Corporation, Armonk, N.Y.

[21] Appl. No.: 185,187

[22] Filed: Apr. 22, 1988

[51] Int. Cl.⁴ .............................................. G02B 17/00
[52] U.S. Cl. ...................................... 350/445; 350/446
[58] Field of Search .................. 350/445, 446, 164–166

[56] References Cited

U.S. PATENT DOCUMENTS

| | | | |
|---|---|---|---|
| 3,712,711 | 1/1973 | Adachi | 350/164 |
| 3,748,020 | 7/1973 | Fischer et al. | 350/445 X |
| 4,128,303 | 12/1978 | Onoki et al. | 350/164 |
| 4,171,871 | 10/1979 | Dill et al. | 350/445 X |
| 4,195,908 | 4/1980 | Kestigian et al. | 350/445 X |
| 4,199,226 | 4/1980 | Weber et al. | 350/445 X |

FOREIGN PATENT DOCUMENTS 2802285 3/1978 Fed. Rep. of Germany .
292125 10/1953 Switzerland ......................... 350/164

Primary Examiner—Scott J. Sugarman
Attorney, Agent, or Firm—John J. Goodwin

[57] ABSTRACT

A beamsplitter optical element, including a triangular substrate, such as a prism, having a plane face corresponding to the hypotenuse of the prism which is coated with a thin film structure having materials and thicknesses, which effect a division of each light beam such as into a reflected and a transmitted portion, in such a way that the beams suffer no net aberration as a result of multiple reflections within the thin film structure, and a second triangular substrate, such as a prism having a plane face, corresponding to the hypotenuse, optically bonded to the thin film structure deposited on the hypotenuse of the first prism.

9 Claims, 19 Drawing Sheets

THIN FILM BEAMSPLITTER OPTICAL ELEMENT FOR USE IN AN IMAGE-FORMING LENS SYSTEM

TECHNICAL FIELD

This invention relates to a thin film beamsplitter structure for use in an optical imaging system, for example, a lithographic imaging system and more particularly to a beamsplitter structure including a prism substrate and a thin film coating.

BACKGROUND ART

Swiss Patent No. 292,125 to Vogt describes multilayer absorption elements selected from materials including hafnium oxide, aluminum oxide, and magnesium fluoride.

U.S. Pat. No. 3,712,711 issued Jan. 23, 1973 to Adachi entitled TRIPLE LAYER ANTI-REFLECTION COATING DESIGN shows a multilayer absorption coating including layers of magnesium fluoride and aluminum oxide.

U.S. Pat. No. 4,128,303 issued Dec. 5, 1978 to Onoki et al entitled ANTI REFLECTION COATING WITH A COMPOSITE MIDDLE LAYER discloses a multilayer (Glayer) optical filter which may be composed of $Al_2O_3$, $MgF_2$ in combination with $TiO_2$, $CeO_2$ or $AvO_2$ (rather than $HfO_2$).

German Patent No. DT 2802285 to Sato describes a structure wherein antireflection films are made from alternating layers of high and low refractive index materials including $MgF_2$ and $AlO_3$.

In addition to the cited references, it is known in the art that thin films and multilayer interference filters may be used for beam splitter applications.

SUMMARY OF THE INVENTION

An object of the invention is to provide a thin film structure that divides the imaging beams in an optical system, without introducing aberration, apodization, or illumination non-uniformity in the image field.

Another object of the invention is to provide a beamsplitter optical element which incorporates a thin film coating on an internal surface, wherein the beamsplitter optical element introduces no uncorrectable aberration, apodization or non-uniformity in an optical system.

A further object of the invention is to provide for better resolution and larger field size in a lithographic lens, by incorporating a beamsplitter optical element that can divide strongly non-collimated beams propagating between large object and image fields, without introducing aberration, exposure non-uniformity, or beam apodization.

Still another object of the present invention is to provide is a thin film beamsplitter optical element which produces a division of optical wavefront in each of a plurality of beams of radiation propagating between object and image fields of an optical system substantially free of aberration, distortion, and apodization.

These objects are accomplished by partially reflecting the non-collimated light beams from a thin film coating on an internal interface of a beamsplitter element, where the thin film coating is structured to divide the light beams into reflected and transmitted wavefronts that are substantially undistorted in phase and amplitude.

BRIEF DESCRIPTION OF THE DRAWINGS

FIG. 9 indicates the difficulty in achieving an unapodized division of beams at a second alignment wavelength through refinement of the reflecting group of layers alone.

DESCRIPTION OF THE PREFERRED EMBODIMENTS

Figure 1:
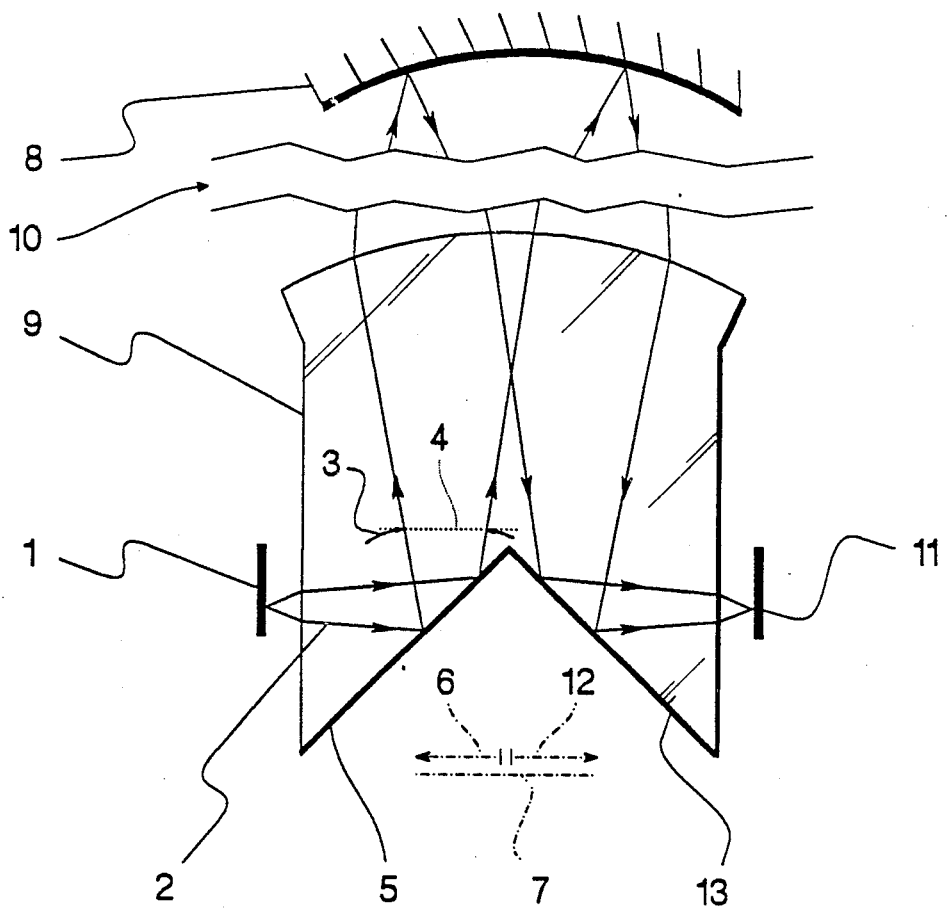
FIG. 1 is a schematic of the optical path in a prior art lithographic system.

Many optical systems involve the projection of light beams from an object field to an image field. Attainable performance in such systems can be constrained by the number of object points which must be imaged (field size), and by the resolution required at each image point. The resolution of an optical system increases when the light beams subtend large cone-angles upon being focused to the image. In the present description of the invention, the divergence angle of a beam when it enters the system will be referred to as the collection angle. If the beam has substantial divergence, it is referred to as non-collimated. It is to be understood that, for simplicity, the cone-angle is referred to as the beam divergence, even in those cases where the beam is being focused. The trigonometric sine of one-half the cone-angle, multiplied by the local refractive index, is referred to as the numerical aperture (NA). Because of the wave nature of light, that section of a spherical shell centered at an object point and enclosed within the cone-angle of a beam from the object point, is referred to as a wavefront. For maximum resolution, this wavefront section must remain spherical and undistorted at the exit of the optical system.

Thus, an advanced optical system with large field-size and high resolution must properly transfer beams of radiation entering the system from a wide range of field directions, the rays in each beam diverging over a wide range of angles. It can then be very difficult to design a system of lenses and mirrors to accomplish such transfer. This difficulty is compounded by the need to accommodate the angle-dependent degradations that will be imposed on the beams by any thin film coatings present in the system, particularly when the beams strike the coatings at oblique angles.

For example, a critical instrument used in the fabrication of integrated circuit chips is the lithographic lens used to project an image of a circuit pattern, referred to also as a mask, onto each circuit chip undergoing fabrication. Most commonly, the shortest practical wavelength is chosen for the light beams illuminating the circuit pattern, since minimum optical resolution is proportional to wavelength, and the finest dimension attainable in the chip is limited by optical resolution. It will be understood that, in the case where a band of wavelengths is used to expose a circuit pattern on a chip, the term exposure wavelength will refer to the central wavelength of the band.

For practical applications, there is a need for lithographic lenses that operate with wavelengths as short as 248 nm, or below. However, at wavelengths below about 300 nm, it becomes more difficult to design lithographic imaging systems whose only elements are conventional transparent lenses, due to materials limitations. It then becomes convenient to incorporate a focusing mirror in the system. Usually focusing mirrors redirect light beams back upon themselves, so such systems use total-reflecting surfaces to split the mirror field of view, into a field for the circuit pattern, and a field for the circuit chip. In such systems the size and sophistication of the circuit chip is constrained, since it can only occupy one-half the total field of the focusing mirror. By field of the focusing mirror, it is meant that region in object or image space, or in any reflection thereof, over which the mirror, in conjunction with the remainder of the optical system, can properly form images.

It is possible to assign all angles in the field of the mirror to the chip field, and also to the mask field, if a beamsplitter element is used to divide each beam of radiation that propagates from mask to chip as described herein below. With such a beamsplitter element, each beam projected from the circuit pattern can be inserted into any portion of the full field of the mirror, and can, after focusing by the mirror, be inserted into the image field on the chip; i.e., each point in the mirror field does "double duty" as an object and image point.

However, because each beam is focused to an image point, it must subtend a wide divergence angle in order that the circuit pattern be finely resolved, and such wide angles will cause a conventional beamsplitter to distort the beam, due to the intrinsic angular dependence of the thin film coatings that are conventionally used in beamsplitters. It will be appreciated that these distortions are introduced by the angular dependence of interference effects in the thin film structure, as distinguished from the geometrical aberrations that are introduced by the beamsplitter substrate. Such distortions and degradations imposed by the thin film structure comprise phase distortions of the wavefront, apodization of the wavefront, and illumination non-uniformity.

Attempts have been made to effect an undistorted division of beams having large divergence angle by using thin film coatings whose thicknesses vary in a wedge-like fashion across the substrate. In such systems the coating thicknesses are in effect adjusted across the surface to match requirements of those rays that are locally incident.

However, this technique is only occasionally encountered in practice, usually only in low precision applications. In optical systems covering a large field, individual optical elements and coatings must often themselves be large. The fabrication of precision thin film coatings over such large areas can be quite difficult, even in the standard case of uniform coating thickness, much less when more complicated thickness profiles are sought. Likewise, in optical systems that seek high resolution through use of short wavelengths, the correspondingly smaller thicknesses required in coatings for such wavelengths will impose an additional burden on the fabrication technology, and will tend to rule out the additional complication of non-uniform thickness profiles.

Layers of particularly small thickness are required in systems that seek to minimize absorption, since residual absorption is approximately proportional to film thickness. Finally, in an optical system with a large field of view, each single region of the beamsplitter must successfully transfer rays from many different light beams originating at different points in the object field. These may be incident from a range of angles as large or larger than the divergence angle in a single light beam, reducing even the theoretical advantages of local thickness tailoring.

FIG. 1 shows schematically the optical path in a typical prior art lithographic lens of the type containing a focusing mirror. A mask 1 containing a circuit pattern is illuminated on one side. Each illuminated resolution element of mask 1 gives rise to a beam of transmitted radiation such as 2, which, due to diffraction, is non-collimated, and which, by definition of a resolution element in a diffraction-limited optical system, has an angle of divergence 3 at any cross-sectional plane such as 4 whose numerical aperture is substantially equal to the mask-side numerical aperture of said optical system, divided by the local magnification of said system at plane 4. A diffraction-limited optical system provides the finest resolution possible for a given angle of collection and a given wavelength. Beam 2 propagates to a total-reflecting-surface 5 which reflects said beam into the mask half 6 of the field of view 7 of a focusing mirror 8. Beam 2 then traverses the solid element 9, and reflects from focusing mirror 8. It is to be understood that solid element 9, or the adjacent space 10, may contain refractive lens elements for the purpose of aberration correction, which for the sake of clarity have not been shown in FIG. 1. Such aberration-correcting refractive elements may also be provided on the surface of focusing mirror 8. After reflection from mirror 8, beam 2 is focused towards an image point 11 in the chip half 12 of mirror field 7. Beam 2 then passes through solid element 9, and is reflected by a second total-reflecting surface 13, to focus at image point 11.

Figure 2:
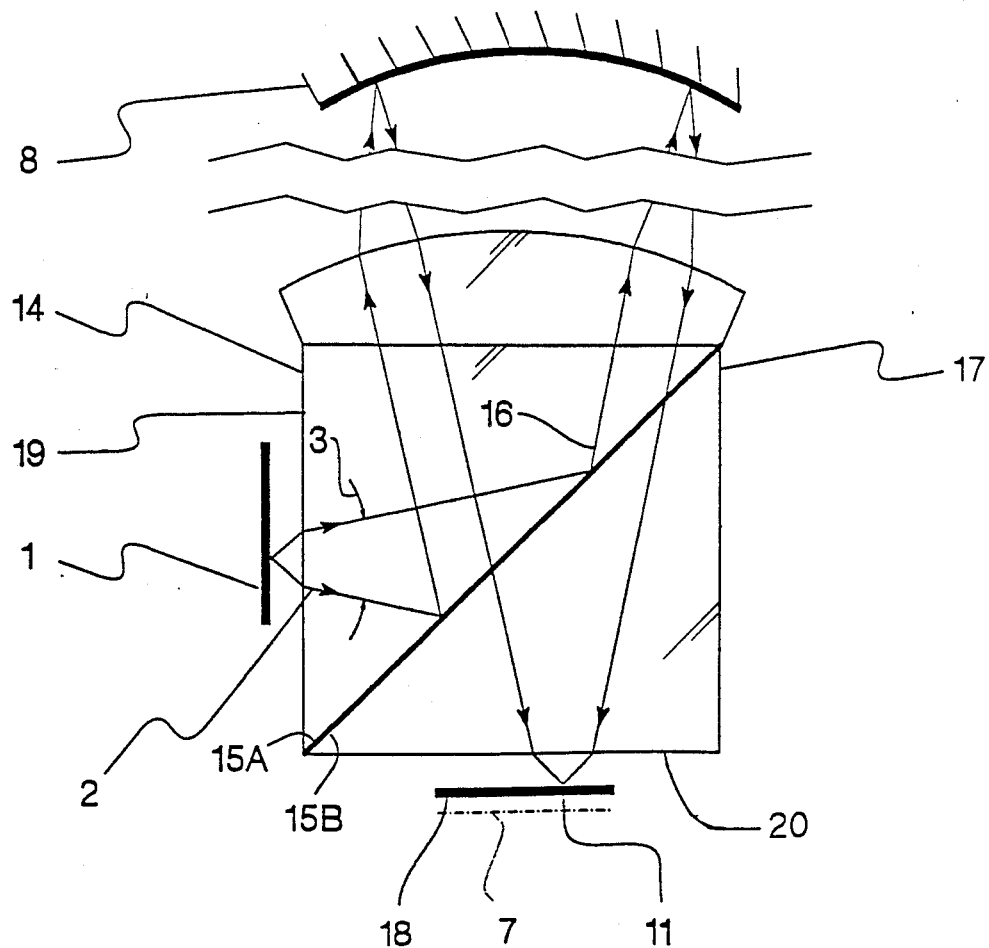
FIG. 2 is a schematic of an improved lithographic system, wherein total-reflecting-surfaces have been replaced by a beamsplitter optical element that reflects and transmits light beams of wide divergence.

FIG. 2 shows in schematic fashion an improved photolithographic system. Here, according to a preferred embodiment of the present invention, solid element 9 and total reflecting surfaces 5 and 13 of FIG. 1 have been replaced by a beamsplitter optical element, comprising a substrate, such as prism 14, whose face 15A corresponding to the hypotenuse is coated by conventional process with a thin film structure having materials and thicknesses, determined by means disclosed below, which effect the desired division of each light beam such as 2 into a reflected 16 and a transmitted 40 portion, in such a way that the beams suffer no net aberration as a result of multiple reflections within the thin film structure, and a second substrate, such as prism 17 whose face 15B, corresponding to the hypotenuse, is optically bonded through conventional means to the thin film structure deposited on the hypotenuse of prism 14.

It should be understood that, for the sake of clarity, the components of the beamsplitter element provided in accordance with the invention have not been drawn to scale, and that the ray paths are likewise rendered in schematic fashion.

Most dividing films will introduce significant variation across the angular divergence of beams such as 2, due to the intrinsic angular dependence of the optical properties of thin films. This angular dependence is most pronounced when the films are tilted relative to the central axis of the beam.

Referring again to FIG. 2, beam 2 is projected from mask 1 to prism face 15A. A reflected portion 16 of beam 2 is then propagated to mirror 8. The fraction of the beam that is reflected in this pass will be referred to as the first-pass beamsplitter efficiency.

After being focused, beam 2 is again incident for a second pass at the thin film coating on prism face 15A. The portion of beam 2 that is transmitted during this second pass is then focused to image point 11 on the circuit chip 18. The efficiency in this pass is equal to the transmitted fraction. Chip 18 may now be large enough to fully occupy the field of view 7 of mirror 8, rather than merely half the field as with total reflecting mirrors 5 and 13 in the prior art of FIG. 1.

The wavelength of beam 2 may be the so-called actinic or exposure wavelength, such as 248 nm, at which the mask pattern is exposed on chip 18. Beam 2 may also contain wavelengths for aligning the mask patterns with previously fabricated patterns on chip 18.

Figure 3:
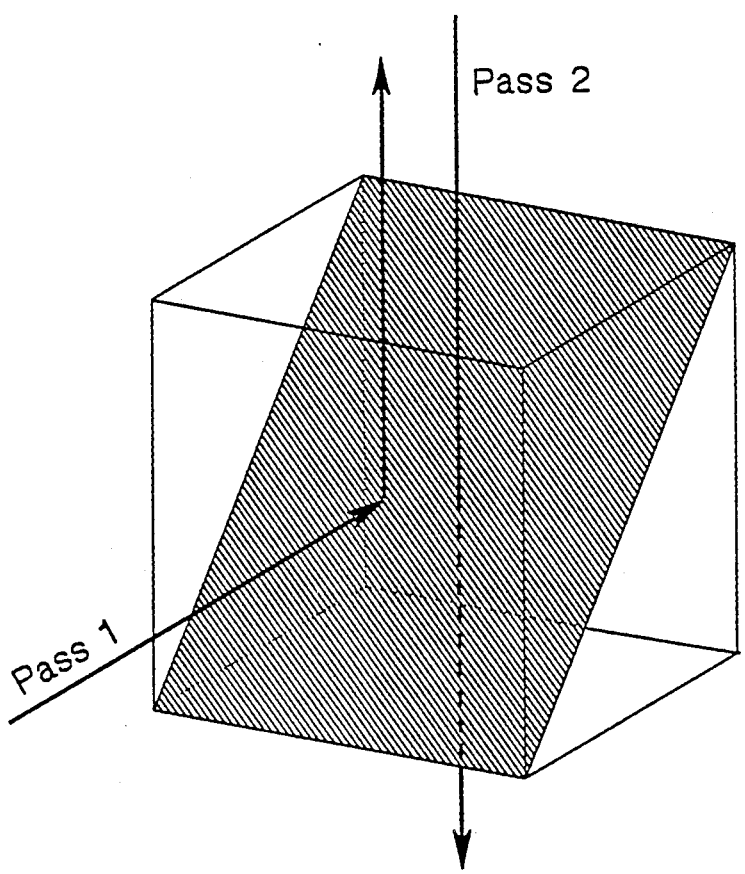
FIG. 3 illustrates in perspective view the two passes at which light beams in the embodiment of FIG. 2 are incident at the thin film coating of the beamsplitter.

FIG. 3 illustrates in perspective view the beamsplitter element of the invention, showing the sequence wherein a light beam is incident at the thin film coating in two different passes through the beamsplitter element.

Referring again to FIG. 2, the thin film structure must be tilted to divide mask 1 from chip 18; however, any parallel tilts in the entrance face 19 or exit face 20 of the substrates will introduce severe aberrations in the imaging beams. Thus, in the example shown, exit faces 19 and 20 are parallel to mask 1 and chip 18 respectively, so that the beamsplitter element in this example forms a unitary structure with the shape of a cube.

Prisms 14 and 17 may then be quite large, particularly in a lithographic system intended for circuit chips of large size, where prism hypotenuses 15A and 15B may, for example, be about 200 mm on a side. In this case substrates 14 and 17 form an effective insulator, and may retain any thermal energy deposited in the thin film structure, such as the thermal energy that will be deposited if the thin film coatings have residual absorption. The resulting temperature rise inside the prisms will in turn give rise to a gradient in refractive index; this gradient can then act to distort propagating wavefronts as they traverse the full double pass thickness of the cube. It is therefore desirable to reduce residual absorption to, for example, ~1% in order of magnitude. This requires particular care in the coating design when short wavelengths such as 248 nm are employed, as further elaborated below. Even films that are nominally dielectric (i.e., non-absorbing) tend to have weak residual absorption at such short wavelengths.

In providing below a thin film coating structure for the embodiment of FIG. 2, the case where beam divergence angle 3 is substantially 43° (NA 0.55 in air), and the exposure wavelength is 248 nm is used as an example.

Figure 4:
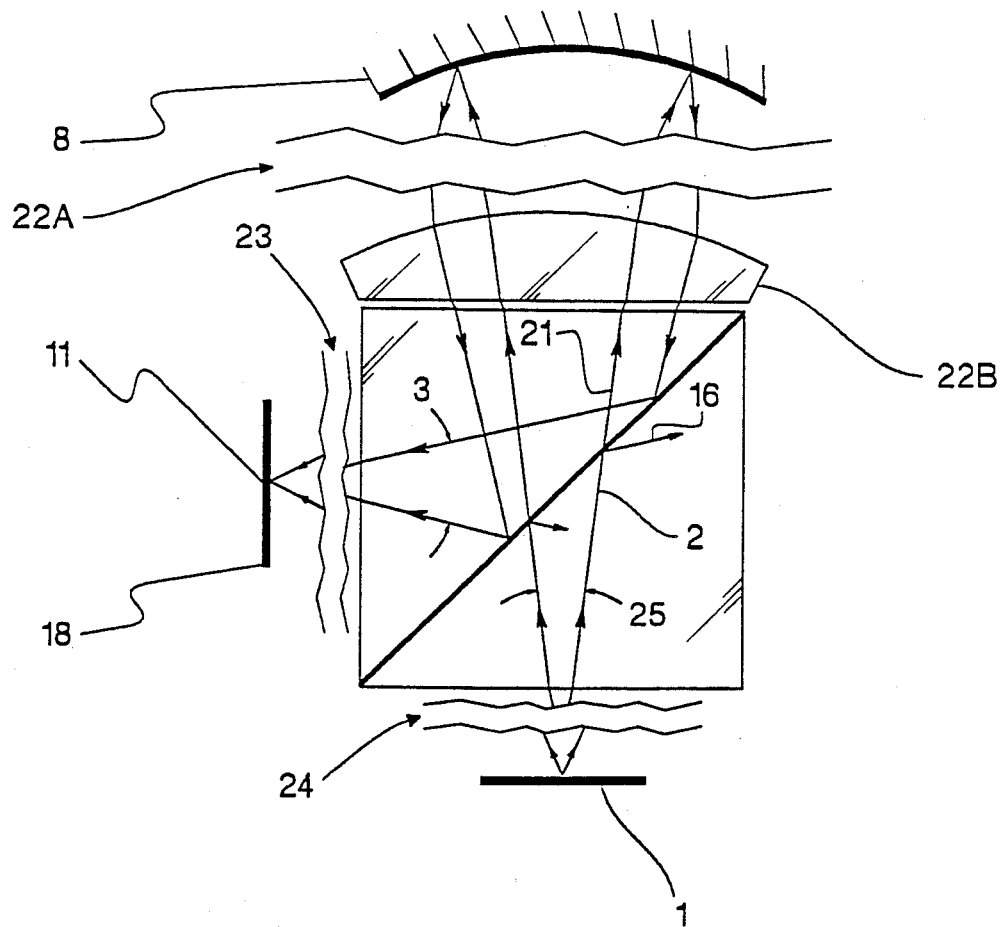
FIG. 4 is a schematic of a lithographic system wherein the beamsplitter element must reflect and transmit light beams of different divergence angles.

FIG. 4 shows, in schematic fashion, another preferred embodiment of the invention, in which mirror 8 is positioned to intercept the transmitted portion 21 of beam 2 during the first incident pass at the thin film coating, rather than reflected portion 16 as in FIG. 2. It should be understood that, for the sake of clarity, the components of the beamsplitter element, provided in accordance with the invention, have not been drawn to scale, and that the ray paths have likewise been rendered in schematic fashion.

Figure 5:
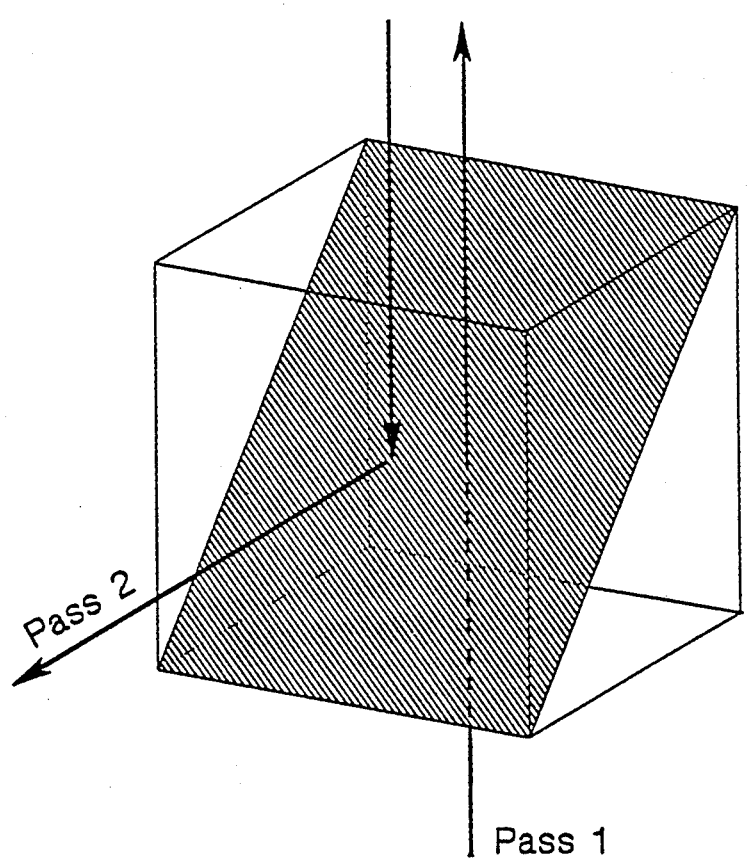
FIG. 5 illustrates in perspective view the two passes at which any light beam in the embodiment of FIG. 4 is incident at the thin film coating of the beamsplitter.

FIG. 5 illustrates the beamsplitter element of the invention in perspective view, and indicates the sequence in which a light beam is incident at the thin film coating in two passes. In the embodiment of FIGS. 4 and 5, the light path sequence may be regarded as the reverse of the sequence in FIG. 3.

Referring again to FIG. 4, during the second incident pass at the thin film coating, the portion of the focused beam that is reflected, as opposed to the transmitted portion as in FIG. 2, is imaged to point 11 on chip 18, substantially without distortion.

FIG. 4 illustrates an effect of lens elements other than the beamsplitter, which may, for example, be located in regions 22A, 23, 24 adjacent to the beamsplitter. These cause the divergence angle in the second pass 3 to be different from that of the first pass 25. One such lens element 22B is shown explicitly. Such elements may be introduced for example, to demagnify the mask 1 image to a different-sized image on chip 18. The fact that divergence angles 3 and 25 are different must be considered in determining a thin film structure that yields substantially no net aberration, apodization, or non-uniformity in the image, as further elaborated below.

Figure 6:
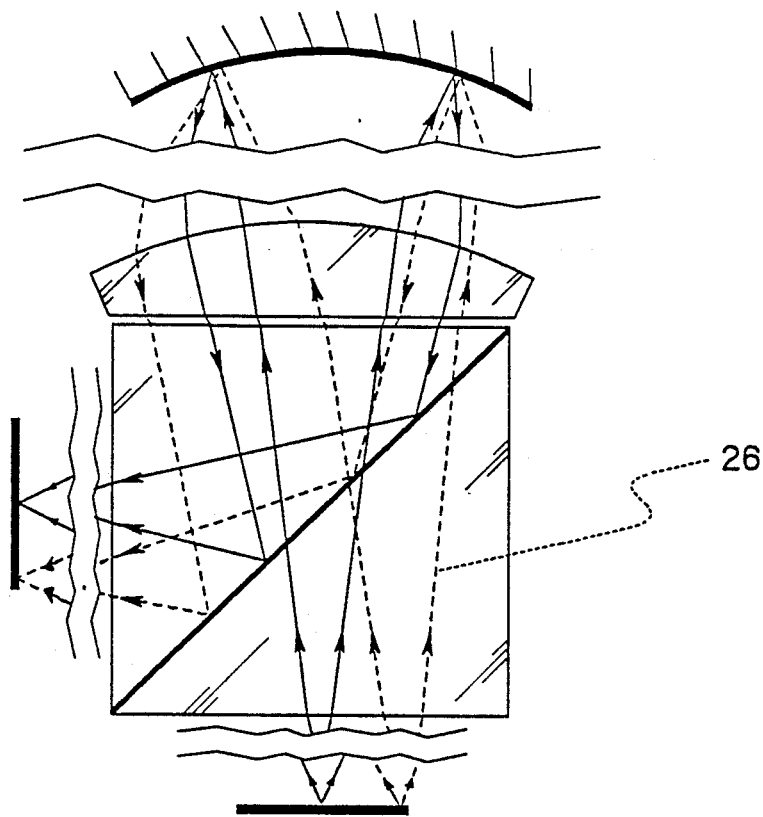
FIG. 6 shows schematically that in the embodiment of FIG. 4, the optical system is non-telecentric at the thin film coating.

FIG. 6 is a second schematic rendering of the optical system in the embodiment of FIG. 4. FIG. 6 illustrates that in this embodiment, the optical system is non-telecentric in the beamsplitter space. This means that the central rays in light beams from different mask points are incident on the thin film structure at different angles, as indicated by the dashed beam 26, so that the effective tilt-angle of the thin film structure varies from beam to beam. Such non-telecentricity might, in general, be an inherent feature of an optical system wherein the beamsplitter element of the present invention can usefully be employed. In order to provide images substantially free of aberration, the thin film coating of the beamsplitter must then accommodate a range of field angles as well as the range of divergence angles within beams, as further elaborated below. In providing below a structure for the thin film coating in the embodiment of FIG. 4, the case where beam divergence angle 25 is substantially 2°, divergence angle 3 is substantially 21°, and the range of incidence angles in the central rays of beams from different object points is substantially 7° is used as an example. The optical system in this example might achieve minimum resolution, in the range, for instance, of 0.3 um to 0.4 um.

Figure 7:
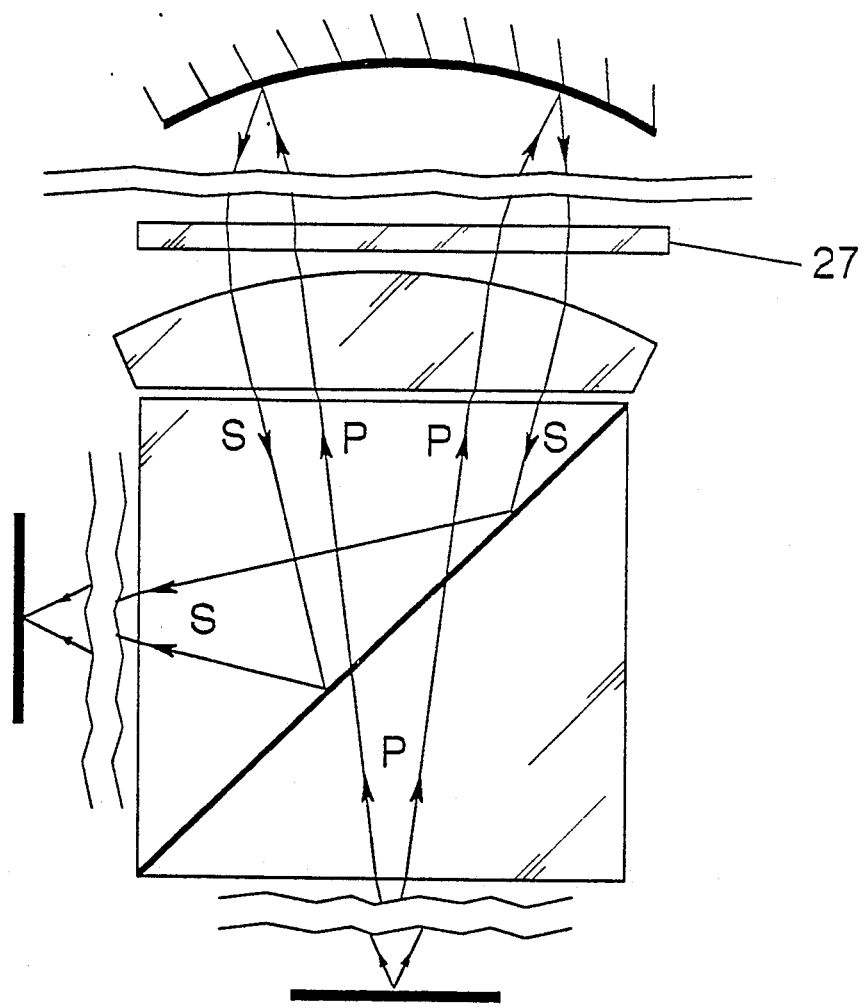
FIG. 7 is a schematic of a lithographic system that contains a quarter-wave plate and a beamsplitter element, in order to deliver increased power to the image.

FIG. 7 shows schematically a further embodiment of the invention, in which a single-order quarter-wave plate 27 is inserted between prism 14 and mirror 8. This device switches the state of polarization from P to S between the two passes at the thin film structure. In the embodiment of FIG. 7, the thin film structure on prism face 15A is adjusted to transmit a large fraction of P polarized light, and to reflect a large fraction of S polarized light, substantially free of net aberration, apodization, or non-uniformity, as further elaborated below. While quarter-wave plate 27 might be very difficult to procure, it would in conjunction with the appropriate thin film structure provided below, allow a larger fraction of the illumination incident on mask 1 to be received at chip 18, through increase of the efficiency at each pass.

In an alternative embodiment of the invention, the thin film structure can be chosen to impose certain residual distortions in the reflected and transmitted beams, rather than reducing them substantially to zero, if these residual distortions are otherwise correctable by means comprising re-figuring mirror 8 or other optical elements in the system, tilting or displacing the optical elements of the system, introducing apodizing elements in the system, or adjusting the uniformity of illumination on mask 1.

In a further embodiment of the invention, the thin film structure introduces distortions in the image-forming beams which compensate distortions introduced by the remainder of the optical system, these distortions not being conveniently correctable therein.

It is to be understood that in any of the above embodiments, either of the two substrates in the beamsplitter may be coated with the appropriate thin film structure, and the other substrate bonded to it.

Considerations in designing the thin film structure for these applications comprise:

1. ACHIEVING APPROPRIATE REFLECTION-TRANSMISSION RATIO: A 50/50 balance yields the optimum two-pass efficiency of 25% in the embodiments of FIG. 2 and FIG. 4. In the embodiment of FIG. 2, a 50/50 ratio may also have the advantage of properly balancing multiple reflections between mask 1 and chip 18.

2. UNIFORM NET TRANSMISSION OVER LENS APERTURE (NA): As mentioned, the intrinsic angular dependence of reflectance and transmittance from thin film structures must be compensated in the design, by means described below. Non-uniform intensity across the wavefront is referred to as beam apodization. In order to avoid excessive apodization of the wavefront, a typical tolerance is that the reflection-transmission product be constant over the wavefront divergence to within ±10%. For example, in the embodiment of FIG. 4, a quadratic apodization in one meridian of 20% (TIR) might give rise to a ~2% difference in image intensity between circuit lines of 0.3 um width that are oriented parallel and perpendicular to this meridian. Stringent intensity tolerances of order 2% are not unusual in lithographic applications.

On the other hand, a linear apodization will give rise to an alignment offset (during the process where the mask pattern is aligned with previously exposed patterns on the chip), because the illumination of the alignment target edges will be asymmetric. In a simulation study of an alignment method known as scanned dark-field alignment, a ±10% linear runout was found to rise to a 0.025 um offset in the worst case considered. Such apodization will also degrade the effective image-side telecentricity, causing additional small image shifts to accompany any minute focal shifts of the chip. In lithographic applications, it is desirable to avoid even small shifts such as these, since typical tolerances on individual contributors to pattern overlay error are ≲10% of minimum printed linewidth. In the embodiment of FIG. 4, the minimum printed linewidth might be, for example, 0.3 $\mu$m.

3. FREEDOM FROM PHASE ABERRATION: As mentioned, a thin film coating introduces changes in phase as well as amplitude. After the low-order effects are accounted for (those that do not affect image resolution, such as piston, tilt, and defocus), a typical design tolerance for residual aberration is ≲λ/12.

4. ABSORPTION: As mentioned, it is desirable to reduce residual absorption in the thin film structure to, for example, the order of magnitude of ~1%, in order to avoid the formation of distorting thermal gradients in the prisms.

5. ILLUMINATION UNIFORMITY OVER FIELD: If the effective tilt angle of the beamsplitter departs from 45° for off-axis object points (as in the embodiment of FIG. 4), typical lithographic tolerances would require that, nonetheless, the net reflected-transmitted intensity of the beams be uniform within ~3% over the field (though as mentioned, in an alternative embodiment of the invention, illumination non-uniformity can be compensated with adjustments in the illumination).

6. INDUCED IMAGE SHIFTS: Many optical systems such as that in FIG. 4 are not telecentric at the beamsplitter. In this case the phase changes introduced by the coating will in general have a field-dependence; this in turn could give rise to x-y-z image displacements. For lithography, a typical tolerance on such image shifts is ≲1/10th the minimum linewidth. On the other hand, a constant phase change at an image point, or an image shift common to all image points, will be referred to as trivial aberration, and is generally not of concern in a lithographic system.

7. SEPARATE ALIGNMENT WAVELENGTH: A number of factors can degrade the alignment signal at the actinic exposure wavelength, making alignment at a second wavelength desirable. Most of the above requirements must then be satisfied at this second wavelength.

8. MINIMUM LAYER THICKNESS: With present technology it is possible to deposit continuous films having thickness well below 100Å. However, as films reach this thickness regime, their optical constants become more difficult to maintain reliably.

Methods are now provided, according to the present invention, for determining the materials and thicknesses of thin film coatings to meet the above requirements. In addition, specific materials and thicknesses for such coatings are provided.

Figure 8:
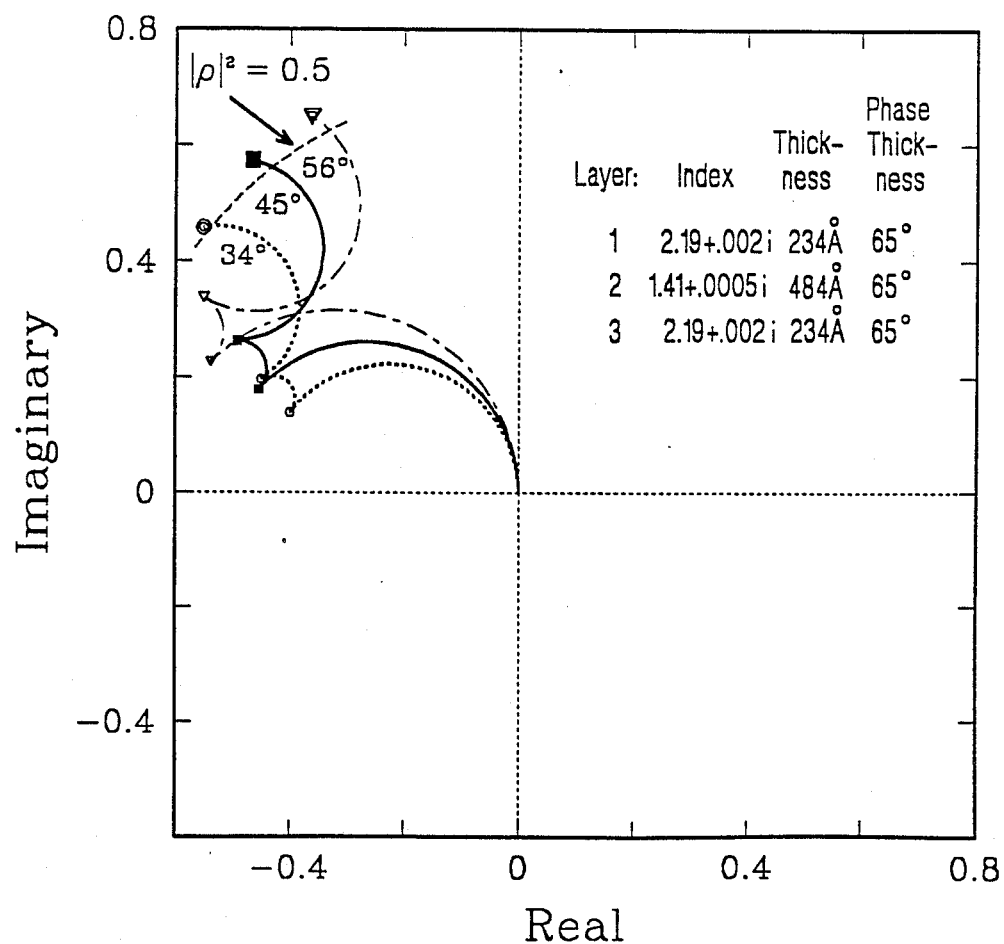
FIG. 8 represents the amplitude reflectivity provided by an initial choice of materials and thicknesses for the first reflecting group of layers in a beamsplitter element for the embodiment of FIG. 4.

To display graphically the thin film structures of the present invention, the so-called circle-diagram as illustrated, for example, in FIG. 8 will be used. The circle-diagram plots the evolution of the amplitude reflectivity as a coating builds up from zero reflectivity at the origin. Since amplitude reflectivity is a complex number, one axis of the graph represents the real part of the amplitude, and the other the imaginary part. In such a diagram, the amplitude reflectivity will trace out a circular arc as each single dielectric layer is coated, with the terminus of the arc corresponding to the final thickness of the layer. A variation of the circle-diagram as developed in the prior art is used proceeding from the incident medium towards the substrate, rather than vice-versa. A similar diagram can be drawn for the transmitted beam, but examples in which the divergence angle of the beam during the transmitted pass is considerably smaller than during the reflected pass will usually be dealt with.

Requirements above for broadband performance over wide angular range can partially be met with an initial group of thin film coatings, which will be referred to as the reflecting group. If such reflecting group is constructed from a detuned quarter-wave stack of layers, it may achieve nearly the uniformity required of the full coating structure; however, if its total thickness is kept small to minimize absorption, it is unlikely to contain sufficient layers to fully meet the above list of requirements. For example, in the embodiment of FIG. 4, a suitable initial group of layers might be the three layer group diagrammed in FIG. 8, comprising layers detuned to 65° phase thickness from the 90° phase thickness that defines a quarter-wave stack. Suitable materials having the refractive indices provided in FIG. 8, may for example, be a layer 1 of hafnia, a layer 2 of magnesium fluoride, and a layer 3 of hafnia. These layers form a high-low-high sequence in refractive index. Refractive indices provided in the figure are complex numbers, the small imaginary parts indicating weak residual absorption in these nominally dielectric films.

In the above description, quarter-wave refers to a layer having particular thickness, defined in terms of a specific image forming beam of the system, namely that beam which projects from the central point in the circuit mask. In particular, quarter-wave refers to a layer whose thickness, after multiplication by the cosine of the angle at which the central ray of this central beam propagates within the layer, is equal to one quarter of the wavelength of the actinic radiation inside the layer, said internal wavelength being the external actinic wavelength divided by the refractive index of the layer. Phase thickness of a layer refers to a scale of normalized layer thickness, wherein 360° represents a full wavelength, and 90° represents a thickness of one quarter-wave.

The three trajectories plotted in FIG. 8 correspond to the extreme angles of incidence during the initial reflection pass at this group of films used in the structure of FIG. 4, for an object point at the center of mask 1, in the case where beam 2 has a divergence angle 3 of substantially ±11° in the reflection pass. FIG. 8 also shows a section of a dashed circle centered on the origin that represents the desirable condition of 50/50 reflectivity, i.e., the squared amplitude reflectivity, $|\rho|^2$, is 0.5.

This simple system achieves fairly uniform reflectivity at all angles within the required 22° range. For example, while the reflectivity of each interface is least for the marginal ray at 34° (indicated by shorter arcs in the diagram), the consequent tendency towards reduced overall reflectivity has been largely compensated, due to the improved tuning of the stack at 34° compared with 45°. That is, at 34° the arcs more closely approach the full semicircles that would correspond to quarter-wave layers. With quarter-wave layers, all interfaces would contribute in phase along semicircle diameters, with in-phase contribution being indicated by diameters that would fall along a single straight line.

Since the stack is somewhat detuned at 45°, it becomes more substantially detuned at 56°. The poorer tuning at 56° largely compensates for the increased interfacial reflectivity, so that little increase in overall reflectivity takes place.

The partial compensation and associated reflection-uniformity are thus a consequence of the detuning from 90° phase thickness to 65° phase thickness at the central ray.

Figure 9:
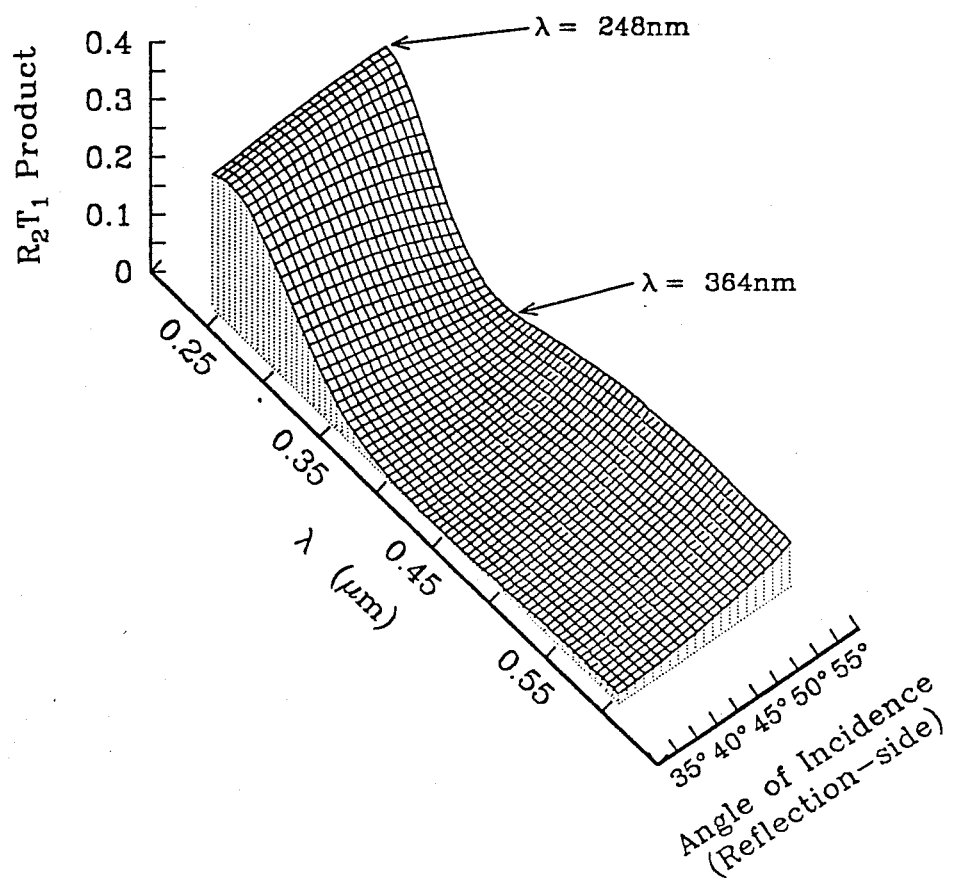
FIG. 9 represents the net two-pass amplitude uniformity achieved by the reflecting group of layers provided in FIG. 8, as a function both of ray angle within the divergence of imaging beams, and as a function of wavelength.

However, it is difficult to satisfy the full list of requirements above with only 3 layers. For example, FIG. 9 indicates the difficulty in refining this system for alignment at long wavelengths. At 364 nm, this 3-layer reflecting group is almost completely antireflected at the larger incidence angles.

These problems are corrected with the addition of a pair of comparatively thin low-high layers (45° phase thickness), which is termed a correcting group. These layers slightly antireflect the net reflectivity established by the preceding 3-layer system, which must then be retuned slightly to re-establish an overall 50/50 division ratio. The variable detuning of these final layers acts to correct the residual non-uniformity at 248 nm. In addition, these layers establish a modest reflectivity at 364 nm. (Full 50/50 efficiency is not required for alignment.)

Figure 10:
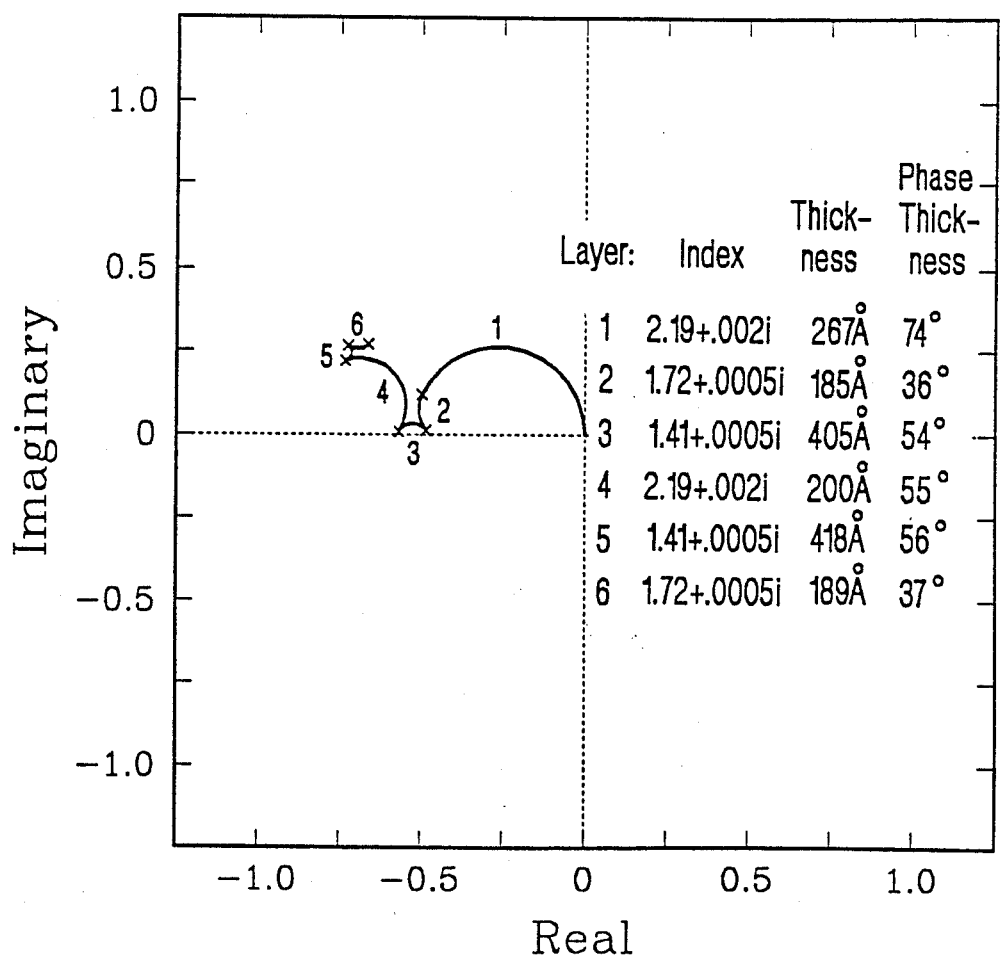
FIG. 10 represents the amplitude reflectivity achieved by the six layer coating therein provided, for the central ray from the midpoint of the object field in the embodiment of FIG. 4, at an exposure wavelength of 248 nm.
Figure 11:
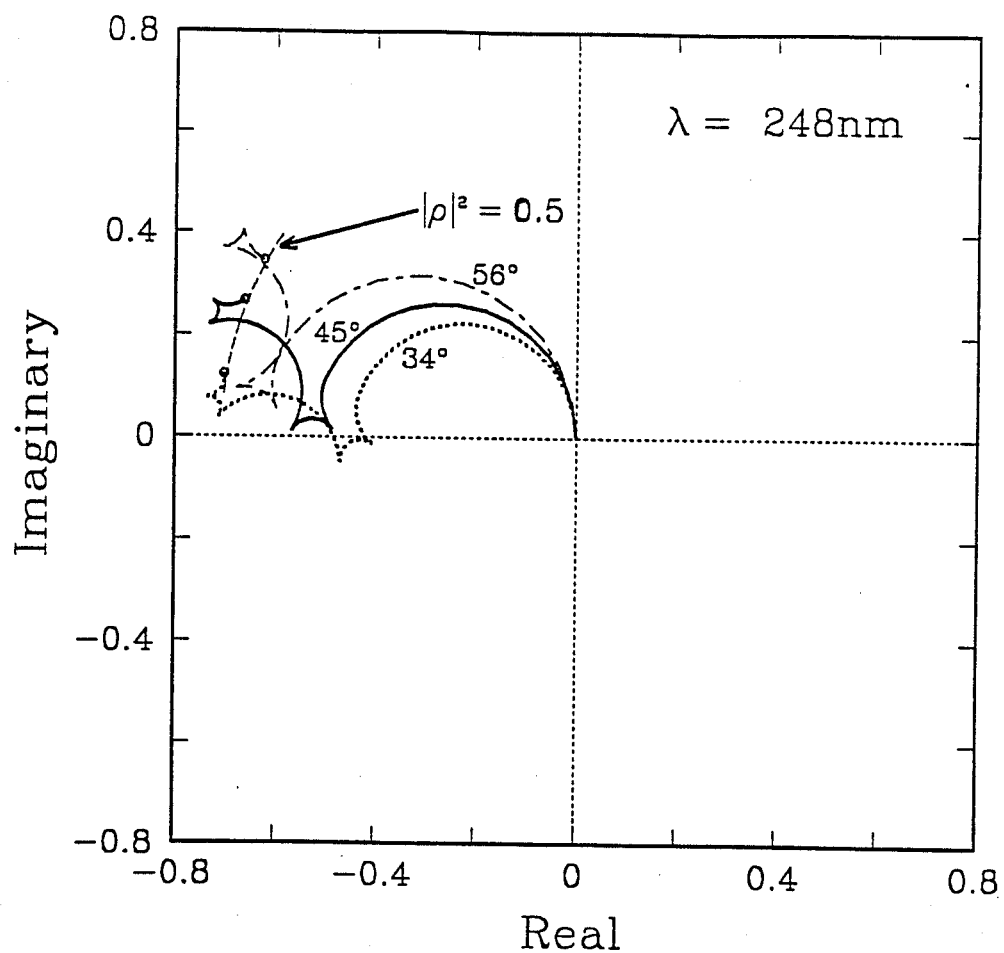
FIG. 11 represents the uniform two-pass amplitude transfer achieved by the coating structure provided in FIG. 10, over the angular range corresponding to the divergence angle of imaging beams in FIG. 4.
Figure 12:
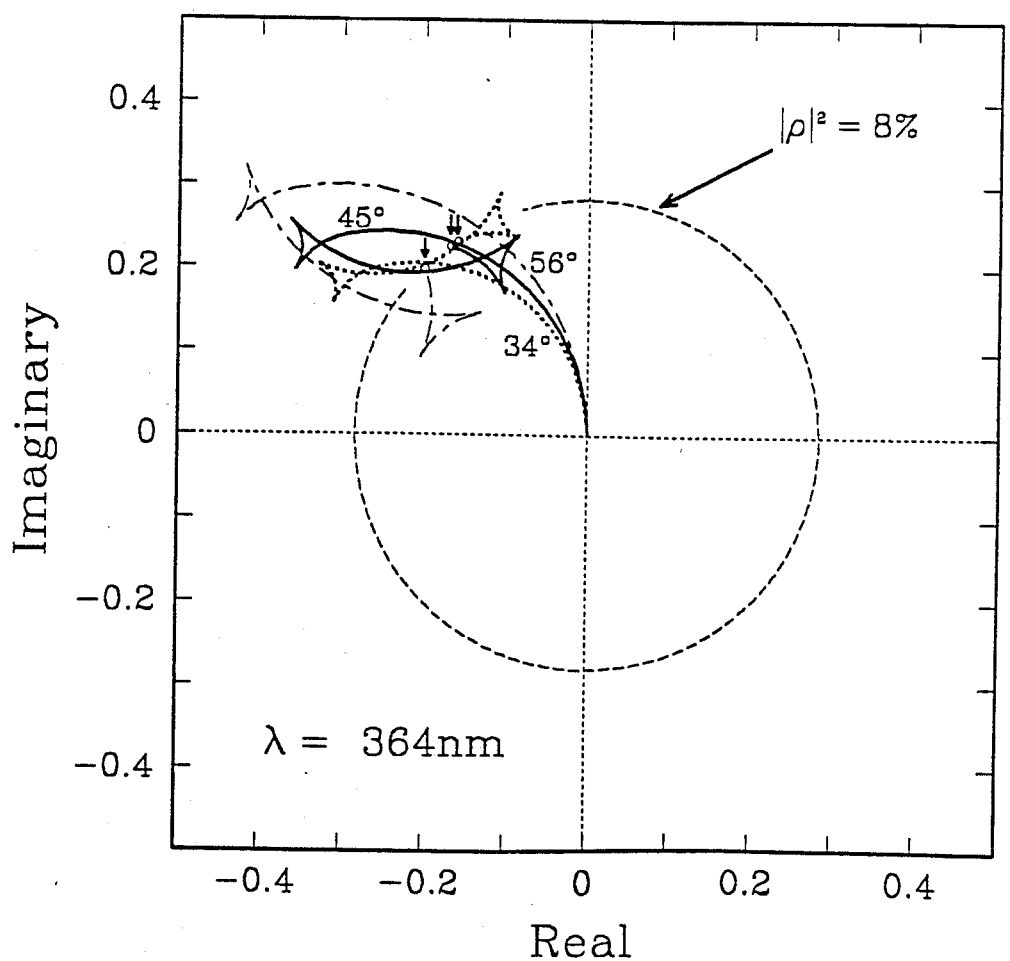
FIG. 12 represents the uniform two-pass transfer that is further achieved by the coating structure of FIG. 10 at an alignment wavelength of 364 nm, with arrows indicating overall reflectivities.
Figure 13:
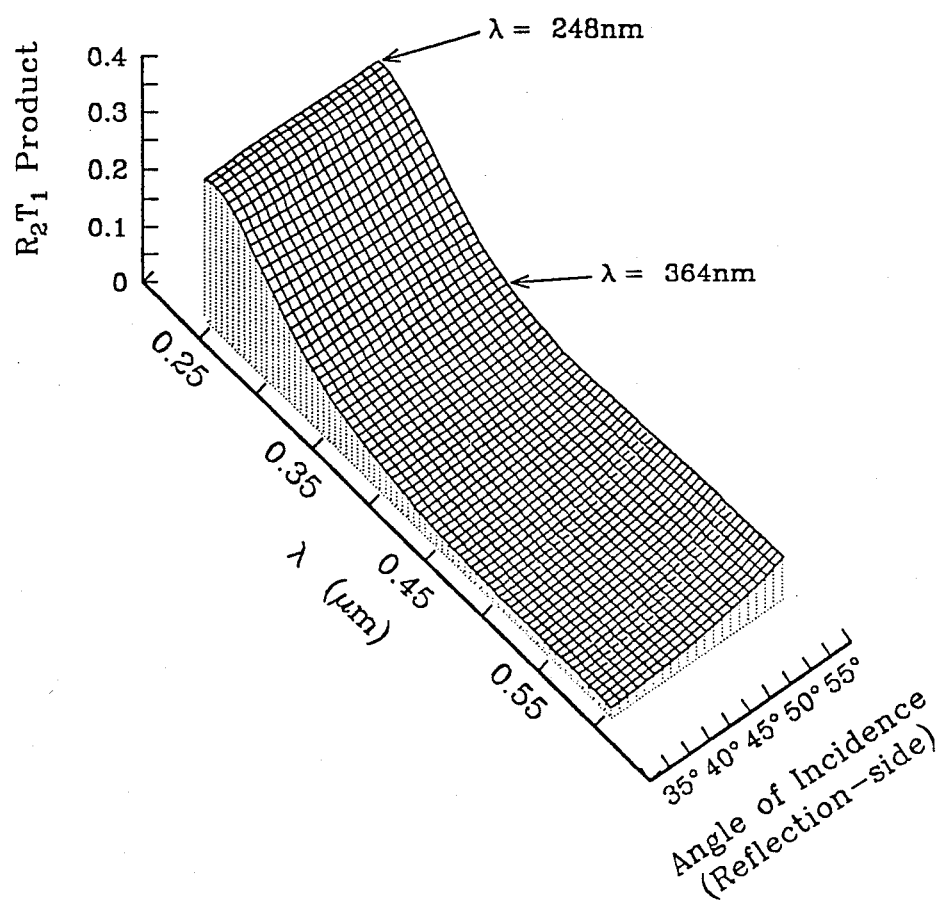
FIG. 13 represents the spectral performance of the coating provided in FIG. 10, and, in comparison with FIG. 9, illustrates the suitability of this coating for refinement to other wavelengths in the range of substantially 248 nm to 400 nm.

Since these latter layers serve only to correct the overall reflectivity established by the preceding group, they need provide only modest contrast in refractive index; thus alumina has been chosen as the high-index layer because of its low absorption. For similar reasons, in the final coating structure provided in FIG. 10, the first high-index layer of the reflecting group is split as a hafnia/alumina pair. This causes little loss in reflectivity, since the final thickness of the pair acts somewhat tangentially to the overall reflectivity. The split also turns out to increase the reflectivity at 364 nm. The absorption in this embodiment is about 1% in each pass at the beamsplitter.

In order to precisely determine the appropriate layer thicknesses, it is advantageous, according to the present invention, to make use of a digital computer, as further elaborated below. The final thickness choices for the coatings provided in accordance with the invention have been obtained with this computer refinement.

FIGS. 10, 11, 12 and 13 display the performance of a coating meeting above requirements, along with spectral and angular performance. Materials for the six coatings indicated in FIG. 10 comprise, respectively (1) hafnia, (2) alumina, (3) magnesium fluoride, (4) hafnia, (5) magnesium fluoride, (6) alumina.

It should be understood that the refractive indices of coatings vary with deposition conditions, so that the structures provided herein in accordance with the invention may require computer refinement to match refractive indicies produced by a particular deposition system. Such computer refinement means are provided below, in accordance with the invention.

Figure 14:
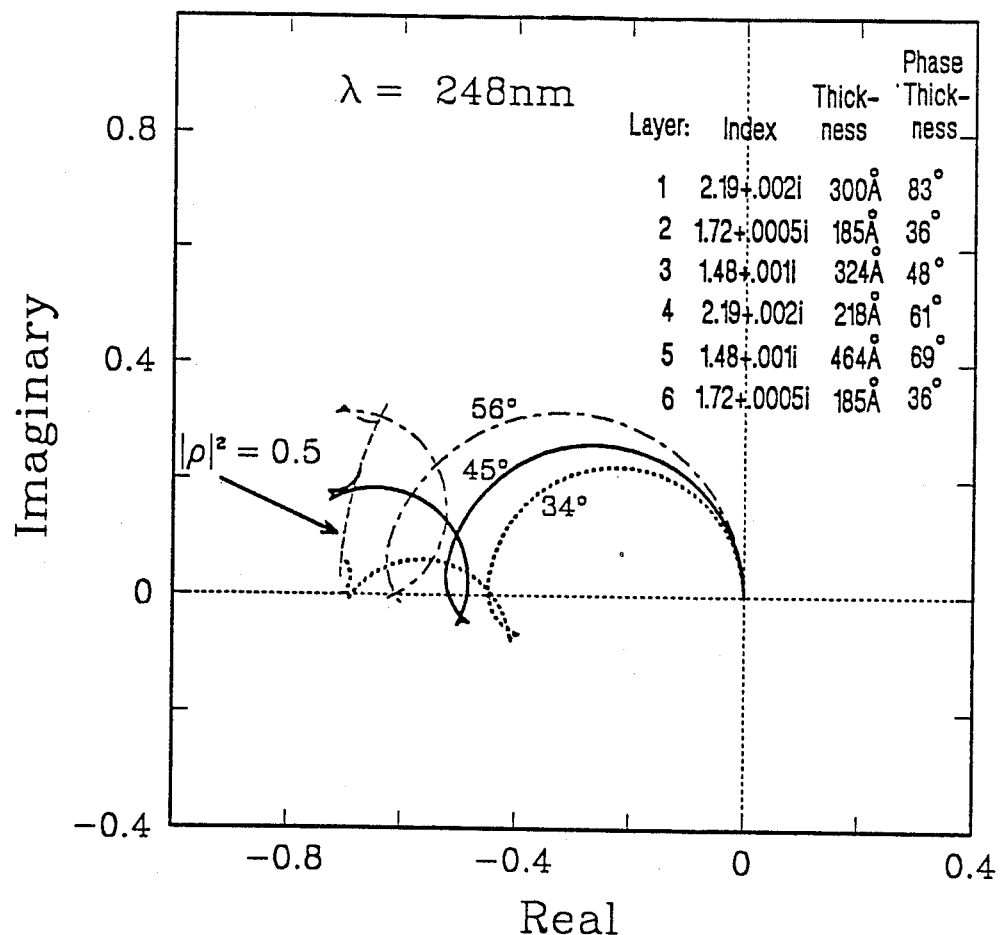
FIG. 14 represents the uniform two-pass transfer achieved by the thin film coating structure provided in the figure, where silicon dioxide has been used as a low index material instead of magnesium fluoride as in FIG. 4.

As another example, if one seeks a thin film coating for the embodiment of FIG. 4 that uses silicon dioxide instead of magnesium fluoride, with the above methods one can obtain the structure described by the circle diagram of FIG. 14. Materials for the six coatings indicated in FIG. 14 comprise, respectively, (1) hafnia, (2) alumina, (3) silicon dioxide, (4) hafnia, (5) silicon dioxide, (6) alumina.

Figure 15:
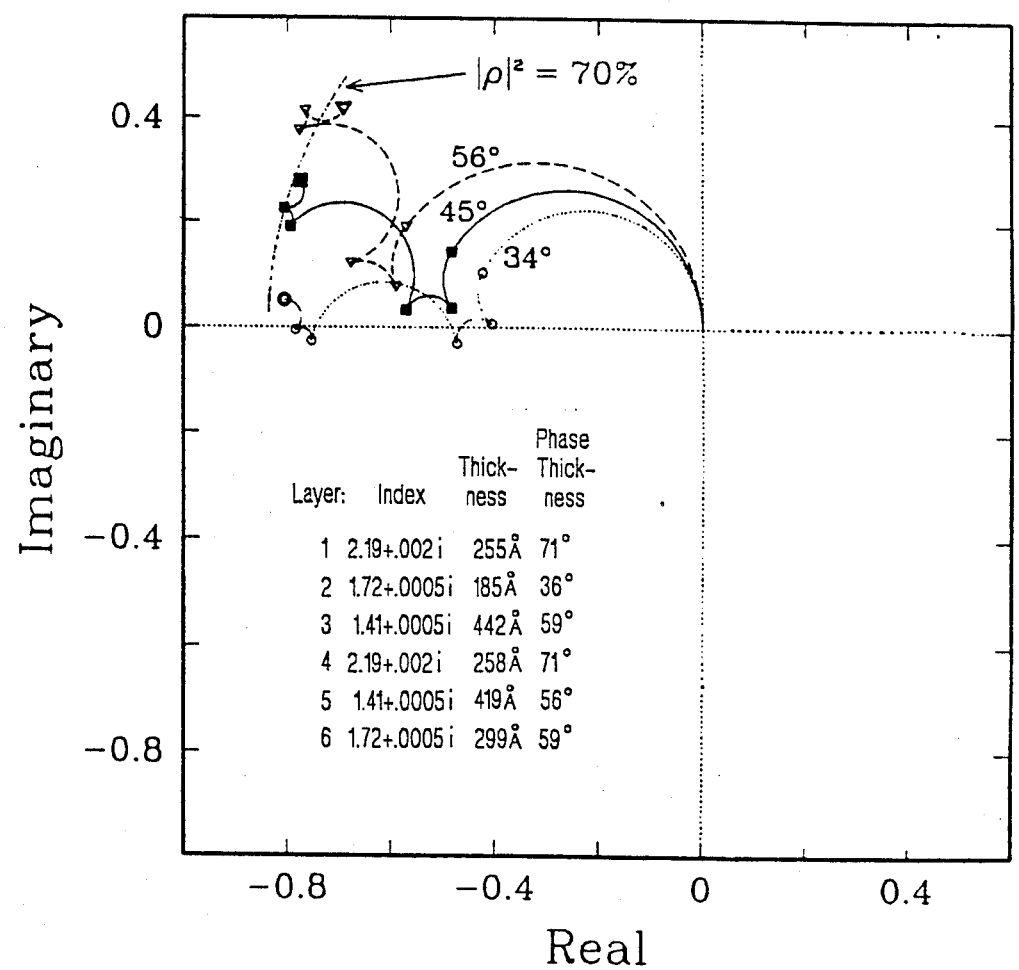
FIG. 15 represents the uniform two-pass transfer achieved by a coating, provided in the figure, that provides a 70/30 reflection-transmission ratio.
Figure 16:
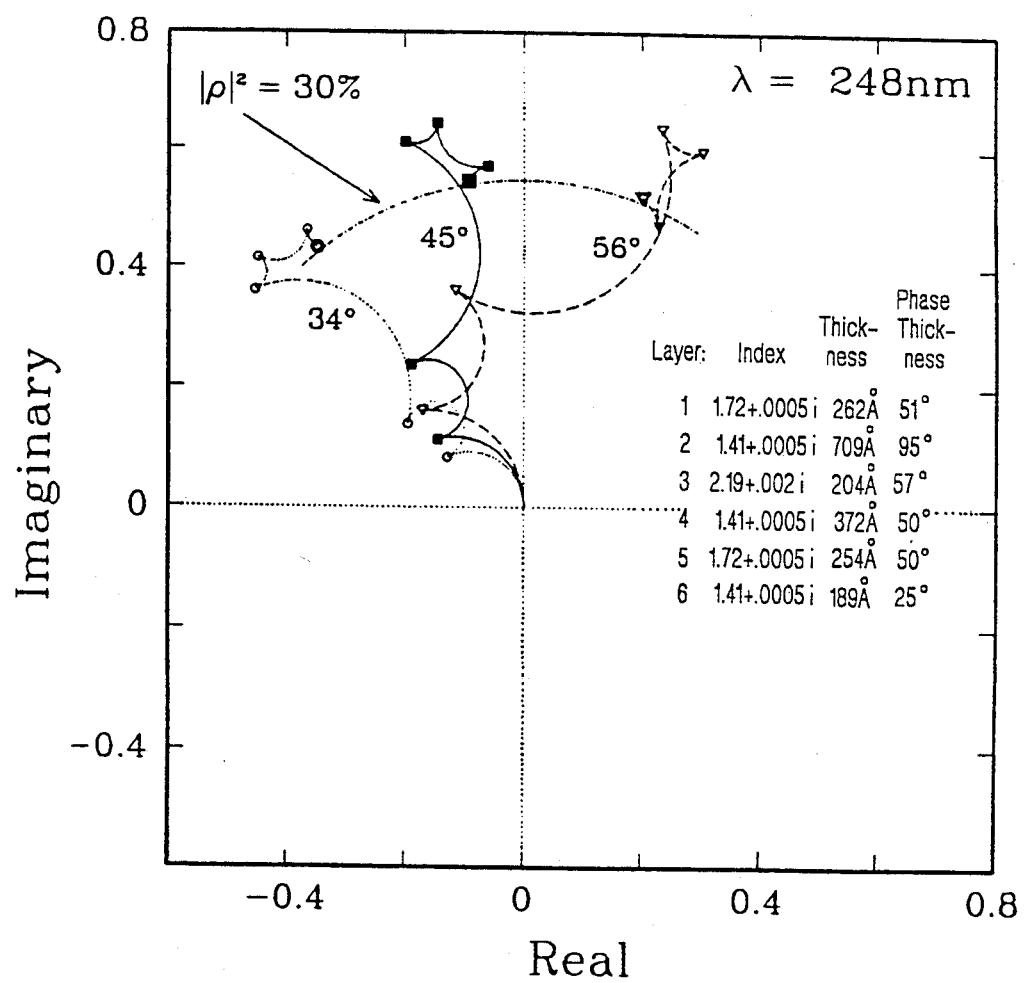
FIG. 16 represents the uniform two-pass transfer achieved by a coating, provided in the figure, that provides a 30/70 reflection-transmission ratio.

Thin film coatings that yield beam divisions other than 50/50 can also be obtained. FIGS. 15 and 16 list coatings that achieve reflection-transmission ratios of 70/30 and 30/70. Materials for the six coatings indicated in FIG. 15 comprise, respectively, (1) hafnia, (2) alumina, (3) magnesium fluoride, (4) hafnia, (5) magnesium fluoride, (6) alumina. Materials for the six coatings indicated in FIG. 16 comprise, respectively, (1) alumina, (2) magnesium fluoride, (3) hafnia, (4) magnesium fluoride, (5) alumina, (6) magnesium fluoride.

Figure 17:
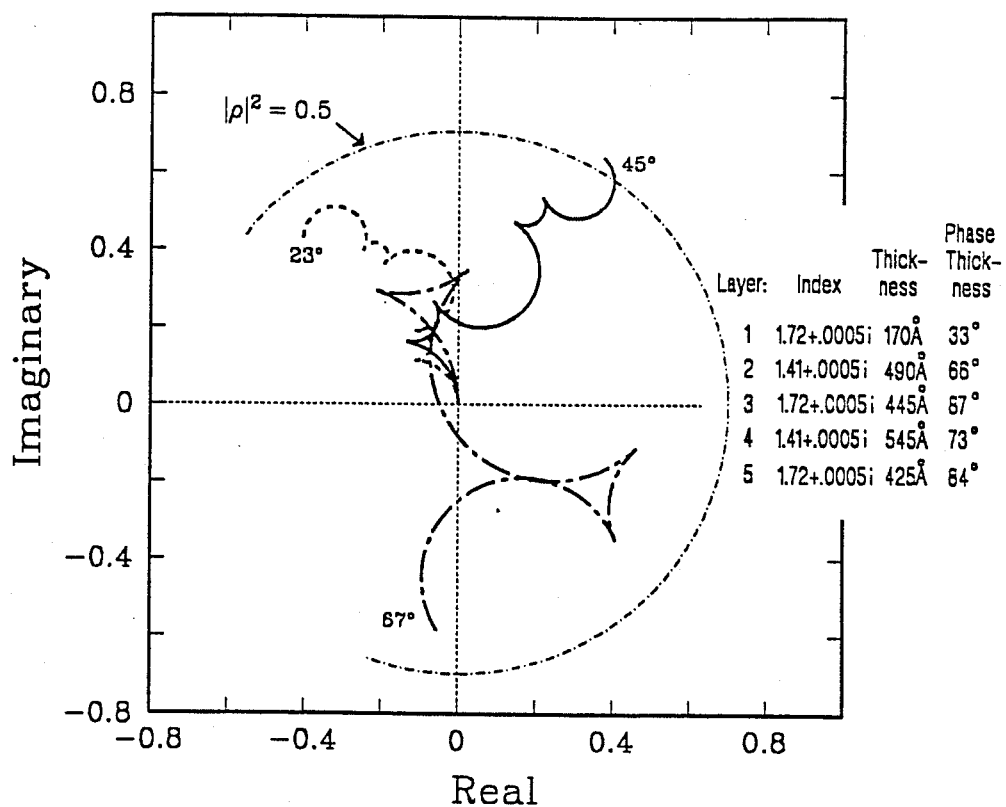
FIG. 17 represents the two-pass uniformity achieved by a five layer coating, provided in the figure, for the beamsplitter in the embodiment of FIG. 2.

In FIG. 17 a thin film coating for the embodiment of FIG. 2 is provided where light beams such as 2 subtend divergence angles of substantially 43° at the beamsplitter. Materials for the five coatings indicated in FIG. 17 comprise, respectively, (1) alumina, (2) magnesium fluoride, (3) alumina, (4) magnesium fluoride, (5) alumina.

Figure 18:
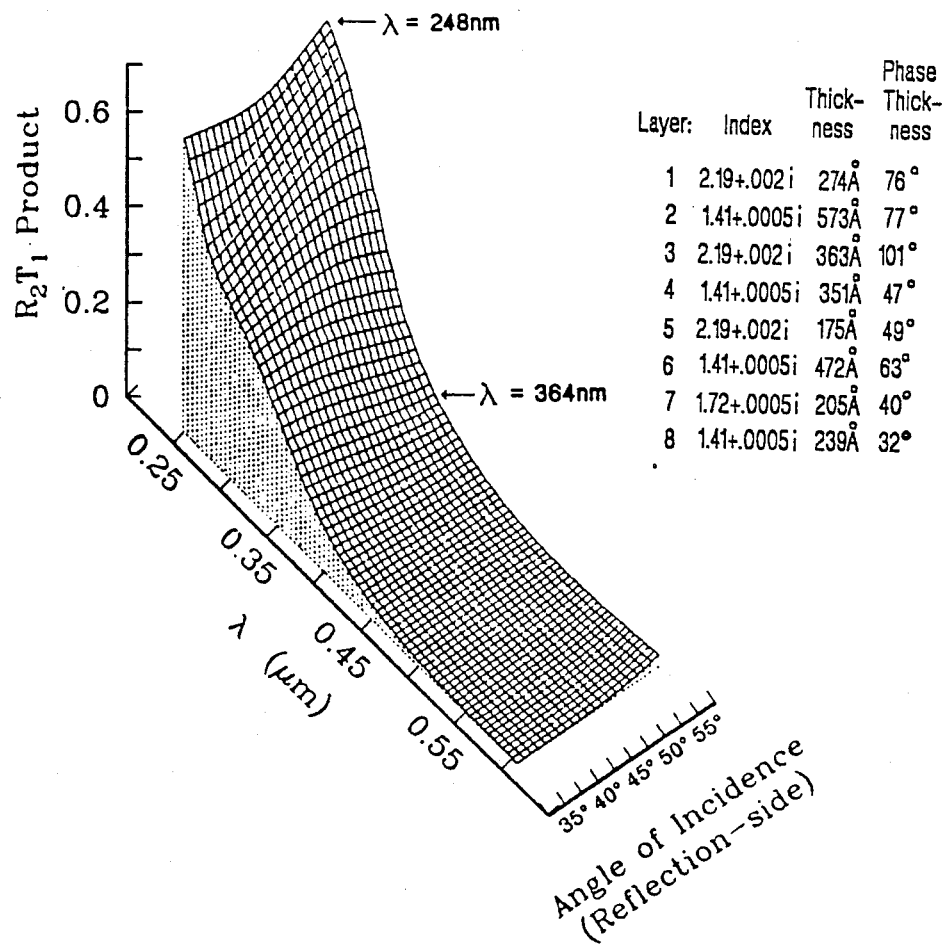
FIG. 18 represents the two-pass uniformity achieved by an eight layer coating, provided in the figure, for the embodiment of FIG. 7.

In FIG. 18 a thin film coating for the embodiment of FIG. 7 is provided which in conjunction with quarter-wave plate 27 delivers substantially 68% of each incident light beam to the image point. Materials for the eight coatings indicated in FIG. 18 comprise, respectively, (1) hafnia, (2) magnesium fluoride, (3) hafnia, (4) magnesium fluoride, (5) hafnia, (6) magnesium fluoride, (7) alumina, (8) magnesium fluoride.

In accordance with the present invention, means are now described for precisely determining appropriate thicknesses for the layers in reflecting and correcting groups provided above. Approximate thicknesses can, for example, be determined by using layers detuned to substantially 65° phase thickness in the reflecting group, and substantially 45° phase thickness in the correcting group.

It is known that approximate coating solutions can be refined by digital computer, if means can be found that establish as a numerical value the difference in performance between any two arbitrary sets of thicknesses. In other words, a merit or demerit function is established for the desired coating application. Merit or demerit functions can then be maximized or minimized by known computational methods. Means are now disclosed for quantitatively determining the degradation imposed by a thin film structure on a light beam in an image forming system, allowing said degradation to be quantified and incorporated in a merit or demerit function.

Figure 19:
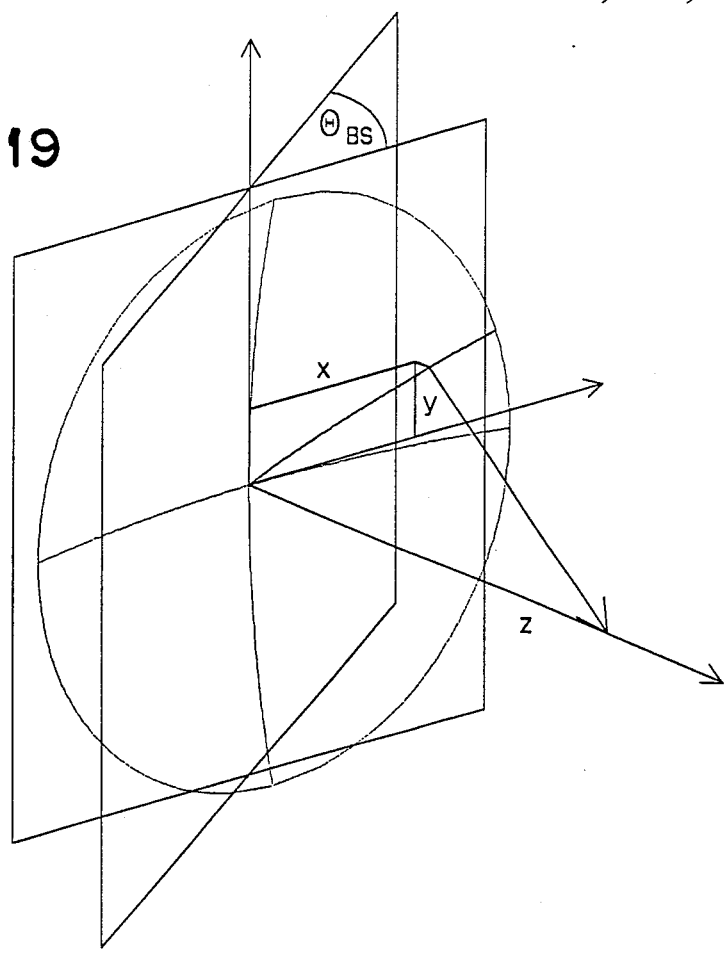
FIG. 19 is a schematic of a reference sphere centered at an image point, used in computer refinement of coating thicknesses.

The procedure begins with consideration of the principal or central rays in each of a number of light beams whose aberration-free focus at the corresponding image points is sought. Referring to FIG. 19, a circular segment of a reference sphere is erected at each object or image point, and a grid of rays within the associated cone, focusing approximately to the image point, is defined. A convenient choice is a rectangular grid, such as a ten-by-ten array, equispaced in direction-cosine; that is, equispaced in the coordinates x and y of the intersections of the rays with said reference sphere, with the central ray forming the z axis.

The rays are then traced through the system using known computational methods. If the aberrations in those portions of the system which precede each coating are sufficiently small that the incidence angles of the rays at the coatings are substantially unaffected by these aberrations, and if the coatings of interest are beamsplitter films, layered on plane surfaces that are tilted in one meridian, the raytrace procedure can be substantially simplified. Cases wherein induced aberrations at a beamsplitter are negligible will be described. These simplifications can be quite important since they dramatically reduce the computation time required for solution.

In such cases one can, with sufficient accuracy, trace each grid of rays by multiplying the x and y coordinates of each ray by the ratio of the numerical aperture at each coating to the numerical aperture at the initial point. These x and y values are conveniently stored in vector form, coresponding to some arbitrary ordering of the rays in the grid. It is also most convenient in this case to choose the initial point, upon which each grid of rays is erected, to be the image point.

In the more general case where induced aberrations cannot be neglected, one can calculate the angle of incidence for each ray at each coating using standard trigonometrical expressions of raytracing. In the simpler case where induced aberrations at a beamsplitter are negligible, the angle of incidence at the thin film structure can be calculated from the formula:

$$\Theta_{inc} = \sqrt{1 - x^2 - y^2} \cos \Theta_{BS} - x \sin \Theta_{BS},$$

where $\Theta_{BS}$ is the tilt angle of the principal ray, as shown in FIG. 19. FIG. 19 also illustrates that in this simple case, the beamsplitter may be treated as effectively lying in the exit pupil of the optical system, if proper scaling of the ray x and y coordinates by local numerical aperture is observed. By the above equation the vectors of x and y coordinates are then transformed into vectors of incidence angles.

Next either the complex amplitude transmittance or the complex amplitude reflectance of each coating structure is calculated by known methods, depending on whether the reflected or transmitted beam propagates to the image.

Figure 20:
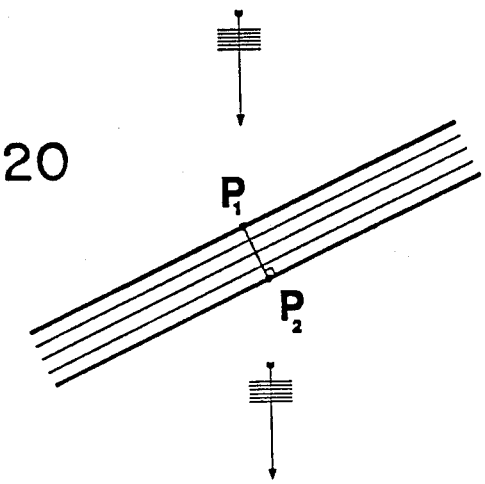
FIG. 20 illustrates the reference points used in computer refinement of thicknesses to determine the effect of a coating on individual angular directions within a transmitted wavefront.

Referring to FIG. 20, when such methods are applied to the transmitted beam, they provide the transmitted amplitude at the exit point $P_2$. In order to properly assign the effect of the coating to the unperturbed ray, incident at $P_1$, it is necessary to account for propagation of the ray from $P_2$ to $P_1$, through division by the null transmittance:

$$\tau_0 = \frac{2\pi n_1 |P_1 - P_2| \cos\Theta_{inc}}{\lambda},$$

where $n_1$ is the refractive index in the incident medium.

Once all reflectances and transmittances have been calculated along the paths from object to image, path lengths are assigned to rays from each object point, through the equation $$\Delta W_j = \frac{\lambda}{2\pi} Im \log\left[\begin{array}{c} \pi\zeta_1 \\ 1 \end{array}\right],$$

where $\lambda$ is the wavelength in the image space, Im represents the imaginary part, $\Delta W_j$ is the thin film induced path length of the jth ray, and where $\zeta_1$ is the complex transfer coefficient of the lth coating (multiple passes at the same coating counted separately), given by $$\zeta_1 = \begin{cases} \rho 1 & \text{if reflected at coating} \\ \frac{\tau 1}{\tau 0} & \text{if transmitted at coating} \end{cases}$$

with $\rho$ and $\tau$ the complex amplitude reflectance and transmittance, respectively.

In the embodiment of the invention where it is desired to have substantially no aberration introduced by the coating, the next step in determining the coating structure is to calculate the RMS aberration for inclusion in the demerit function. The RMS aberration is obtained by first finding the least-squares solution to the matrix equation:

$$\begin{pmatrix} \Delta W_1 \\ \Delta W_2 \\ \vdots \end{pmatrix} = \begin{pmatrix} 1 & x_1 & (1 - \sqrt{1 - x_1^2 - y_1^2}) \\ 1 & x_2 & (1 - \sqrt{1 - x_2^2 - y_2^2}) \\ \vdots & \vdots & \vdots \end{pmatrix} \times \begin{pmatrix} \text{Piston} \\ \Delta X_{tilt} \\ \Delta Z_{defocus} \end{pmatrix}$$

This equation is solved for the piston-tilt-defocus vector by taking the pseudo-inverse of the non-square matrix on the right-side, which for the jth ray is referred to as $M_j$.

If it is desired that the coating introduce no distortion or field non-flatness, the displacement and defocus of each image point are calculated from $$\begin{pmatrix} \text{Piston} \\ \Delta X_{tilt} \\ \Delta Z_{defocus} \end{pmatrix}_j = M_j^{-1} \times \begin{pmatrix} \Delta W_1 \\ \Delta W_2 \end{pmatrix}_j$$

Such displacement values are conveniently stored in vector form, of length equal to the number of image points considered. The RMS variation in displacement and the RMS variation in defocus over all image points can then be added to the demerit function, with appropriate weights.

In order to achieve stigmatic imaging, the squared residual aberration at each image point is calculated from $$\left(\frac{\Delta W}{\lambda}\right)^2 = \left| \begin{pmatrix} \Delta W_1 \\ \Delta W_2 \\ \vdots \end{pmatrix} - M^{-1} \times \begin{pmatrix} \Delta W_1 \\ \Delta W_2 \\ \vdots \end{pmatrix} \right|^2$$

where the vertical bars indicate the norm of the vector. The RMS residual error from all image points can then be added to the demerit function.

In the embodiment of the invention where a thin film structure is desired whose aberrations are restricted to those substantially correctable in the remainder of the optical system, additional columns for these correctable aberrations are added in the matrix M. Each such element entered in matrix M represents the path length that would be introduced in the ray corresponding to the row if the optical system had one wave maximum error of the aberration corresponding to the column. If the optical system is not telecentric at the coating, it is also necessary in this case to use single large vectors and matrices containing all rays from all image points, rather than separate vectors and matrices for each different image point.

In the embodiment of the invention where aberrations elsewhere in the optical system are corrected by determining an appropriate structure in the thin film coating, the geometrical path length of the ray as found by conventional raytracing methods can be added to each element of each vector of raypath lengths. In this case, the coating imposes phase and amplitude distortions on each beam which may be regarded as substantially the algebraic negatives of those imposed by the remainder of the optical system.

In addition to the image degradations and displacements that result from phase changes that might be introduced by the coating, it is also necessary to consider amplitude effects, that is, effects resulting from the variation with angle of the energy transfer effected by the coating.

To include such effects in the demerit function, a grid of amplitude transfer values for each image point, i.e, for the jth ray as first obtained.

$$\mathscr{R}_j = \pi_1 \begin{pmatrix} |\rho_1|^2 & \text{if reflected at coating} \\ |\tau_1|^2 & \text{if transmitted at coating} \end{pmatrix}$$

Such intensity values are conveniently stored in vector form, of length equal to the number of image points considered.

The $\mathscr{R}_j$ are averaged at each image point to obtain the illumination distribution due to coatings of the system. The non-uniformity in illumination over the image field is then added to the demerit function.

The non-uniformity in $\mathscr{R}_j$ at any one image point represents apodization in the wavefront focused to that point. The maximum variance is added to the demerit function.

What has been described are embodiments of a beamsplitter structure for an optical imaging system such as a lithographic lens.

The beamsplitter incorporates a thin film coating on an internal surface with the result that the beamsplitter optical element introduces no uncontrollable aberration, apodization, or non-uniformity in the imaging system.

Having thus described my invention, what I claim as new, and desire to secure by Letters Patent is:

1. A beamsplitter structure producing a division of wavefront in each of a plurality of beams of radiation propagating between object and image fields of an optical lens system, wherein said divided wavefronts propagate to the image field of said optical system substantially free of aberration, distortion, and apodization, said beamsplitter structure comprising:
    first and second prisms disposed in an optical lens system, said first and second prisms composed of a material capable of supporting the propagation of
    image-forming beams of radiation having divergence angles and wavelength employed by said optical system and including at least one plane surface prism face on each prism,
    a plurality of thin-film coatings of dielectric materials layered on said plane surface of said first prism,
    wherein said plurality of thin-film coatings on said first prism include
    a first number of coating materials having selected composition and thicknesses to establish the approximate overall reflectivity of said beamsplitter, each of said coating materials having phase thickness less than one quarter of the minimum wavelength present in the central one of said image-forming beams; and
    a second number of coating materials having selected composition and thicknesses for correcting any non-trivial phase aberration and any non-uniform amplitude reflectance and transmittance provided by the initial plurality of coatings with minimal added net reflectivity
    said materials and having uniform thicknesses over said surface to produce a compensating phase distribution and a compensating amplitude distribution in the reflected and transmitted portions of said beams, when said beams are incident at said plane surface from outside said first prism or from inside said first prism;
    said compensating phase and amplitude distributions being substantially the algebraic negatives of the phase aberrations and amplitude nonuniformities of the remainder of said optical lens system,
    wherein said compensating phase distribution produced by said thin-film coatings, corresponds to the trivial aberrations of piston and field-independent image shift, and wherein said compensating amplitude distribution corresponds to substantially equal and uniform reflection and transmission of each of said beams over their full divergence,
    said at least one plane surface of said second prism being bonded to said thin film coatings on said first prism, on the opposite side of said thin film coatings from said first prism on which said thin film coatings are layered.

2. A beamsplitter structure according to claim 1, wherein said first number of coating materials includes coatings of hafnia, coatings of alumina, and coatings of magnesium fluoride, and wherein said second number of coating materials include coatings of alumina and coatings of magnesium fluoride.

3. The beamsplitter structure according to claim 1, wherein said plurality of thin film coatings include a sequence of six successive coatings, composed respectively of hafnia, alumina, magnesium fluoride, hafnia, magnesium fluoride, and alumina, having respective phase thicknesses at the minimum wavelength present in the central one of said image-forming beams, of substantially 74°, 36°, 54°, 55°, 56°, and 37°.

4. The beamsplitter structure according to claim 1, wherein:
    said plurality of thin film coatings include a sequence of five successive coatings, composed respectively of alumina, magnesium fluoride, alumina, magnesium fluoride, and alumina, having respective phase thicknesses at the minimum wavelength present in the central one of said image-forming beams, of substantially 33°, 66°, 87°, 73°, and 84°.

5. The beamsplitter structure according to claim 1, wherein:
    said plurality of thin film coatings include a sequence of six successive coatings, composed respectively of hafnia, alumina, silicon dioxide, hafnia, silicon dioxide and alumina, having respective phase thicknesses at the minimum wavelength present in the central one of said image-forming beams, of substantially 83°, 36°, 48°, 61°, 69°, and 36°.

6. The beamsplitter structure according to claim 1, wherein:
    said plurality of thin film coatings include a sequence of six successive coatings composed respectively of hafnia, alumina, magnesium fluoride, hafnia, magnesium fluoride and alumina,
    having respective phase thicknesses at the minimum wavelength present in the central one of said image-forming beams, of substantially 71°, 36°, 59°, 71°, 56°, and 59°.

7. The beamsplitter structure according to claim 1, wherein:
    said plurality of thin film coatings include a sequence of six successive coatings composed of alumina, magnesium fluoride, hafnia, magnesium fluoride, alumina and magnesium fluoride,
    having respective phase thicknesses at the minimum wavelength present in the central one of said image-forming beams, of substantially 51°, 95°, 57°, 50°, and 50°, 25°.

8. The beamsplitter structure according to claim 1, wherein:

said plurality of thin film coatings include a sequence of eight successive coatings composed respectively of hafnia, magnesium fluoride, hafnia, magnesium fluoride, hafnia, magnesium fluoride, alumina and magnesium fluoride, having respective phase thicknesses at the minimum wavelength present in the central one of said image-forming beams, of substantially 76°, 77°, 101°, 47°, 49°, 63°, 40°, and 32°.

9. A method for adjusting trial thickness values of a thin film coating prior to reflection and transmission of a plurality of beams of radiation from said thin film coating, so as to set a demerit function to an extremum; said method for adjusting said trial thickness values of said thin film coating providing beams of radiation that are image-forming by comprising the steps of:

(a) representing each of said beams as a vector of rays that intercept a reference sphere, (b) forming a vector of x direction cosine coordinates and a vector of y direction cosine coordinates for the intersections of said vector of rays with said reference sphere, (c) forming a vector of ray incidence angles for the intersections of said grid of rays with said thin film coatings, (d) transforming said vector of ray incidence angles into a vector of reflected amplitudes and a vector of transmitted amplitudes, (e) transforming said vector of reflected amplitudes and said vector of transmitted amplitudes into a vector of ray effective path lengths, a grid of total ray amplitudes, and a grid of field illumination values, (f) deriving image aberrations, image displacements, and illumination nonuniformities, for incorporation in said demerit function.

* * * * *